United States Patent
Proepper

(10) Patent No.: US 8,764,410 B2
(45) Date of Patent: Jul. 1, 2014

(54) CAPACITIVE DEVICE AND METHOD FOR THE ELECTROSTATIC TRANSPORT OF DIELECTRIC AND FERROELECTRIC FLUIDS

(75) Inventor: Thomas Proepper, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 557 days.

(21) Appl. No.: 12/737,379

(22) PCT Filed: Jun. 10, 2009

(86) PCT No.: PCT/EP2009/057159
§ 371 (c)(1),
(2), (4) Date: May 24, 2011

(87) PCT Pub. No.: WO2010/003752
PCT Pub. Date: Jan. 14, 2010

(65) Prior Publication Data
US 2011/0220330 A1    Sep. 15, 2011

(30) Foreign Application Priority Data

Jul. 7, 2008    (DE) .......................... 10 2008 040 225

(51) Int. Cl.
*H02K 44/02*    (2006.01)
(52) U.S. Cl.
USPC .......................................................... 417/50
(58) Field of Classification Search
USPC ............................................... 417/48, 50, 53
See application file for complete search history.

(56) References Cited

U.S. PATENT DOCUMENTS

| | | | |
|---|---|---|---|
| 2,691,303 A | * | 10/1954 | De Boisblanc ............ 73/861.11 |
| 3,906,415 A | | 9/1975 | Baker |
| 4,220,195 A | | 9/1980 | Borgoyn et al. |
| 4,396,055 A | * | 8/1983 | Mitchell, Jr. ............. 165/104.23 |
| 4,774,453 A | | 9/1988 | Dechene et al. |
| 7,133,786 B1 | | 11/2006 | Dykesteen et al. |
| 2002/0122728 A1 | | 9/2002 | Darabi et al. |
| 2003/0098588 A1 | | 5/2003 | Yazawa et al. |
| 2007/0044572 A1 | | 3/2007 | Davis et al. |

FOREIGN PATENT DOCUMENTS

| | | |
|---|---|---|
| DE | 1 601 184 | 5/1970 |
| DE | 40 12 268 | 10/1991 |
| DE | 10 2007 018 752 | 10/2008 |
| EP | 1 754 957 | 2/2007 |
| WO | WO 02/07292 | 1/2002 |
| WO | WO 2004/001944 | 12/2003 |
| WO | WO 2007/072914 | 6/2007 |
| WO | WO 2008/128745 | 10/2008 |

* cited by examiner

*Primary Examiner* — Bryan Lettman
(74) *Attorney, Agent, or Firm* — Kenyon & Kenyon LLP

(57) ABSTRACT

In a method for conveying at least one heat exchange medium which includes at least one first fluid having a first permittivity and at least one second fluid which does not mix with the first fluid and has a second permittivity that differs from the first permittivity, at least one dielectric boundary surface is formed between the first and the second fluid, which boundary surface is exposed to a progressively excited electric displacement field which exerts a displacement force on the at least one dielectric boundary surface.

17 Claims, 13 Drawing Sheets

CAPACITIVE DEVICE AND METHOD FOR THE ELECTROSTATIC TRANSPORT OF DIELECTRIC AND FERROELECTRIC FLUIDS

BACKGROUND OF THE INVENTION

1. Field of the Invention

The present invention relates to a device and a method for conveying fluid media.

2. Description of Related Art

For the cooling of electrical, electronic or micromechanical components and integrated circuits, the convection of liquid or gaseous fluids driven by turbo or displacement pumps is widespread. Through thermal diffusion, the recirculated fluid absorbs the heat at the hot, small surface of the component to be cooled and transmits it to a heat exchanger having a large surface in the form of thin lamellae or ribs on the system surface, usually the housing of the subassembly, which has excellent thermal conductivity. The media flow at the outer surface has an advantageous effect inasmuch as it counteracts boundary layer effects, which have an adverse effect on the heat transfer.

In comparison with the passive heat transfer via thermal diffusion, the (forced) coolant recirculation driven with the aid of pumps or fans requires a greater outlay in the construction. Furthermore, electrical or mechanical driving power is consumed, which therefore increases the overall power losses.

The cooling of electronic components such as output stage transistors and voltage converters as well as the cooling of highly integrated microprocessors and other digital circuits (ASICs) during operation at high clock rates is widespread and realized by the recirculation of air or water using displacement or turbo pumps (fans), in particular when high local power loss densities and thermally disadvantageous operating environments are involved. In addition to water and air, fuels or oils are also used as heat exchange media for the cooling of electronic control devices in machine plants or in engine and transmission control devices of motor vehicles.

The cooling of electronic engine control devices in the construction of motor vehicles by fuel recirculation, for example, poses high, cost-intensive demands on the long-term durability and long-term tightness of the pipes, pumps, valves and heat exchangers. Even the leakage of small quantities of fuel from the coolant circuit frequently causes the electronics to malfunction.

In addition, the passive fluid recirculation based on the principle of self-maintaining convection is known, especially the "heat pipe", which is common in the area of computer electronics. This is a hermetically sealed system for the heat transfer, which uses evaporation cooling and self-maintaining coolant convection. The boiling temperature point of the fluid used lies in the thermal operating range of the heat source to be cooled. The liquid phase wets the inner wall of a thin pipe, and the gaseous phase, driven by the gas pressure in the interior of the pipe, is able to flow to the heat sink and dissipate the evaporation heat to a heat exchange element there by condensation. The thickness of the fluid layer wetting the inner pipe wall is restricted by the capillary effect, which allows only relatively small pipe diameters and therefore restricts the heat flow cross-section of the heat pipe.

Furthermore, electrical cooling using Peltier elements on the basis of the thermo-electrical Peltier effect is known. Such elements are made up of two interconnected semiconductors, whose lower conduction band edges lie at different energy levels. If an electrical voltage is applied across the boundary layer between the semiconductors, so that an electrical current is flowing from the semiconductor having the higher conduction band edge in terms of energy (heat source), to the semiconductor having the lower conduction band edge (heat sink) in terms of energy, then the flow of electrical conduction current will also be accompanied by a heat flow from the heat source to the heat sink. By relaxation, the electrons migrating from the heat source to the heat sink transmit to the lower conduction band edge a portion of their thermal excitation energy absorbed in the heat source, to the crystal lattice of the heat sink.

This thermoelectrically induced heat flow is counteracted by the heat diffusion; in addition, unavoidable Ohmic losses heat up the semiconducting materials. Thus, the thermal utilization factor of Peltier elements is low in comparison with other known cooling mechanisms. In addition, they themselves may possibly require more installation space than the electronic components to be cooled. Moreover, Peltier elements are relatively expensive and as a consequence are generally not considered for widespread use.

BRIEF SUMMARY OF THE INVENTION

According to the present invention, a device and a method are provided for conveying at least one heat exchange medium, which includes at least one first fluid having a first permittivity, and at least one second fluid having a second permittivity that differs from the permittivity of the first fluid; the first fluid does not mix with the second fluid in the liquid phase, which causes at least one dielectric boundary surface to come about between the first and the second fluid. The at least two fluids having different permittivities thus form a layered dielectric and may consist of homogeneous substances or substance mixtures or of inhomogeneous mixtures such as emulsions or suspensions.

The device according to the present invention includes a capacitive system, which has at least two adjacent electrodes in whose interspaces at least one flow channel extends, inside which the at least one heat exchange medium is flowing. According to the present invention, each electrode is connected to precisely one electrical voltage source of a voltage-control device, or to precisely one electrical charge source of a charge-control device, each electrode being able to be charged and discharged independently of the other electrodes.

Furthermore, the excitation of at least one electrical field by the electrode system according to the present invention in the at least one flow channel is provided, the field being excited particularly in the environments of dielectrical boundary surfaces of the at least two fluids having different permittivities in the heat exchange medium.

The electrical field causes displacement forces in the environments of the dielectric boundary surfaces, which act in the direction of increasing capacitance of the field-exciting electrodes. The fluid sections having higher permittivity strive to reach the field-filled interspaces of the electrodes and displace the fluid sections having lower permittivity which, over all, causes the heat exchange medium to move in the direction of the displacement forces due to the cohesion forces in the fluids. This effect comes about both at a constant voltage and a constant charge of the field-exciting electrodes and is independent of the local orientation of the electrical field vector since, with the exception of thermal fluctuations, the molecular dipole moments of dielectric fluids and ferroelectric colloids preferably align parallel with the local electrical field (orientation polarization).

Moreover, according to a further development of the present invention, a method is provided for determining the capacitance of field-exciting electrodes (capacitance matrix) and, additionally, for determining the position of dielectric boundary surfaces between fluids having different permittivities. A capacitive measuring device such as a capacitive measuring bridge is connected to the clamps of the electrode system. The shifting of a dielectric boundary surface due to the electrical displacement field changes the capacitance of the particular field-exciting electrodes in whose sphere of influence the dielectric boundary surface is located. Using the voltage-control device, the voltages applied at the field-exciting electrodes are varied. If this causes a change in the capacitance of the electrodes, then a dielectric boundary surface is situated in the electrode interspace. On the other hand, if the capacitance of the electrodes does not change, then the flow channel section in the electrode interspace is homogeneously filled with a single fluid. In this manner the position of all dielectric boundary surfaces is detected. The capacitance (capacitance matrix) of the field-exciting electrodes having a homogeneous as well as a layered dielectric can be determined empirically or with the aid of numerical methods; in the case of a simple or symmetrical electrode geometry as in the case of a plate capacitor or circular-cylindrical capacitor, it may also be known analytically.

Furthermore, according to a further development of the present invention, a method is provided which, through progressive, voltage- or charge-controlled charging and discharging of the electrode system according to the present invention, causes an excitation of an electrical field in the at least one flow channel of the at least one heat exchange medium that progresses in the displacement direction, in particular in regions of dielectric boundary surfaces between the at least two fluids having different permittivities and being contained in the heat exchange medium. In each displacement step, the electrode system maintains an electric field excitation which is running ahead of the dielectric boundary surfaces in the displacement direction, until the displacement forces have subsided and the capacitance of the field-exciting electrodes no longer increases. According to the present invention, the voltage- or charge-control device then transfers the charges to the electrodes adjacent in the displacement direction, which may be connected in parallel in order to increase their capacitance, and the next displacement step is carried out.

According to the present invention, the displacement method using a voltage- or charge-control device progressively charges only the particular electrodes in whose interspaces dielectric boundary surfaces are found, using the afore-described method for capacity determination. In a manner that is advantageous in terms of energy, the electrical field excitation is therefore restricted to the environments of the boundary surfaces, since displacement forces are acting on the heat exchange medium only in that location. The electrical displacement field is excited locally and maintained until the capacitance of the field-exciting electrodes no longer increases any further and the influenced dielectric boundary surface progresses no further, thereby ending the displacement step.

According to one further development of the method according to the present invention, the displacement steps are implemented using temporarily constant voltages at the electrode clamps or temporarily constant charges on the electrodes.

According to one further development of the present invention, the voltage- or charge-control device superposes to the progressively excited electrical displacement field a static electrical field, which counteracts the outflow of the dielectric fluids contained in the heat exchange media from the device according to the present invention, provided the permittivity of the medium surrounding the device according to the present invention is lower than the permittivity of the fluids in the heat exchange medium.

According to one further development of the present invention, at least one of the fluids of the heat exchange medium consists of a homogeneous ferroelectric substance, in particular a ferroelectric liquid crystal, or of a suspension or emulsion containing ferroelectric colloids.

According to one further development of the present invention, the heat exchange medium includes at least one first fluid section, which consists of the liquid phase of a dielectric fluid, and at least one further fluid section, which consists of the vapor phase of this first fluid.

According to one further development of the present invention, the boiling temperature point of at least one of the fluids contained in the heat exchange medium lies in the thermal operating range of the at least one heat source to be cooled or the at least one heat sink to be heated.

According to one further development of the present invention, a method is provided for determining the flow rate of at least one dielectric boundary surface between fluid sections having different permittivities, the temporal change of the capacitance of field-exciting electrodes being determined in whose interspaces a dielectric boundary surface, which flows along with the heat exchange medium, is situated.

According to one further development of the present invention, based on the method for determining the flow rate, a method is provided, which determines the length of homogeneous fluid sections via a temporal correlation of the capacitance variations of different electrodes whose interspaces have been penetrated by dielectric boundary surfaces between fluid sections having different permittivities.

According to one further development of the present invention, based on the method for determining the electrode capacitance and for determining the position of dielectric boundary surfaces between fluid sections having different permittivities, a method is provided for determining the fluid density and the fluid temperature. Here, using the afore-described method, the particular field-exciting electrodes are found whose interspace is filled with a homogeneous fluid section of the heat exchange medium. If a homogeneous dielectric fill is present, the measured capacitance depends only on the temperature-dependent dielectric orientation polarization of the fluid. The correlation between temperature and polarization in fluids having a permanent molecular dipole moment such as water, for example, is known from the Debye equation, and for the fluids having an induced dipole moment, from the Clausius-Mossotti equation. According to the present invention, the functional correlation between the measured capacitance of the electrodes as well as the dielectric polarization and temperature of the dielectric fluid is represented as numerical algorithm in the program of a microcomputer.

According to the present invention, the numerical algorithm in the program sequence of this computer determines the heat flow through the field-exciting electrode system on the basis of the measured capacitance and the temperature of the homogeneous fluid section enclosed by the electrodes, in conjunction with the flow rate determined according to the present invention and the known specific heat capacitance of the fluid.

The embodiments of the device according to the present invention are particularly suitable for the electrostatic convection drive of dielectric as well as ferroelectric fluids, and are advantageously utilized in convection circuits for the cooling or heating of electric, electronic or micromechanical subassemblies in engine and transmission control devices of motor vehicles as well as machine plants, which must satisfy high demands with regard to robustness, freedom of maintenance and service life.

Furthermore, the embodiments of the device according to the present invention are suitable for use in mobile electronic terminals such as laptops, PDAs etc., whose accumulators have low charge capacities and do not allow the use of power-draining, electrically driven coolant convection with the aid of pumps or fans. Furthermore, the present invention is suitable as auxiliary drive for recirculating the liquid phase of the heat exchange medium in a heat pipe having self-maintaining convection.

In miniaturized form, the electrodes and flow channels of the device according to the present invention are suitable for being embedded in multi-layer electronic circuit boards or ceramic substrates; the electrodes are able to be interconnected with the electronic subassemblies and may be used as capacitors having variable capacitances in the microelectronic or micromechanical subassemblies to be cooled or heated.

Embodiments of the present invention having an external electrode implemented in one part, which is embodied as sealed outer wall of the flow channel, are electromagnetically completely shielded. The signal integrity of electronic components and circuit traces is not adversely affected, and no electromagnetic interference occurs at the electrodes during the transient excitation of the electrical displacement field.

DETAILED DESCRIPTION OF THE INVENTION

FIGS. 1 through 23 represent cutaways of example embodiments of the device according to the present invention in a longitudinal section along the displacement direction of the heat exchange medium.

Figure 1:
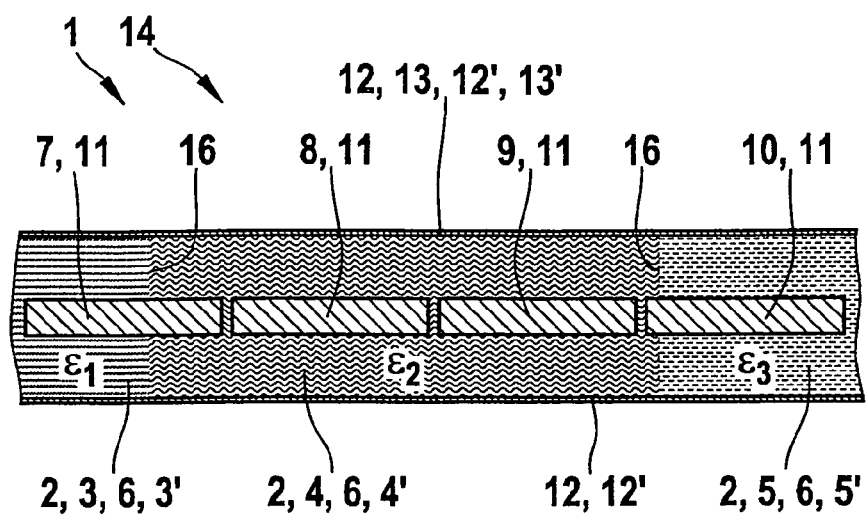
FIG. 1 shows a sectional view of a first example embodiment of the device according to the present invention.

FIG. 1 shows a first example embodiment 1 of the device for conveying a heat exchange medium 2 according to the present invention, which has a first dielectric fluid section 3' having a first permittivity $\in_1$, a second dielectric fluid section 4' having a second permittivity $\in_2$, and a third dielectric fluid section 5' having a third permittivity $\in_3$, second permittivity $\in_2$ differing from third and first permittivities $\in_3$, $3_1$, respectively. Non-mixing fluids 3, 4 and 5 form dielectric boundary surfaces 16 and thus a dielectric that is layered in the flow direction of heat exchange medium 2. Furthermore, a compact outer electrode 12 in one piece is provided, which is realized as outer wall 12' of a flow channel 6 and encloses individual inner electrodes 7, 8, 9 and 10 which are separate from each other, situated along the displacement direction and form an inner electrode 11 implemented in several parts. Outer electrode 12 and inner electrode 11 are galvanically separated from each other. Outer electrode 12 and inner electrodes 7, 8, 9, 10 of an electrode system 14 have interspaces that form flow channel 6 inside which heat exchange medium 2 is flowing.

According to a further development of first example embodiment 1, a first plate-type outer electrode 12 and a second plate-type outer electrode 13, which is separated from outer electrode 12, are provided. Furthermore, inner electrodes 7, 8, 9, 10 are developed in the form of plates and implemented separately from outer electrodes 12 and 13. Outer electrodes 12 and 13 are implemented as outer walls 12', 13' of flow channel 6, which accommodates heat exchange medium 2. The further outer walls of flow channel 6 parallel to the paper plane are not shown in the sectional view according to FIG. 1.

Figure 2:
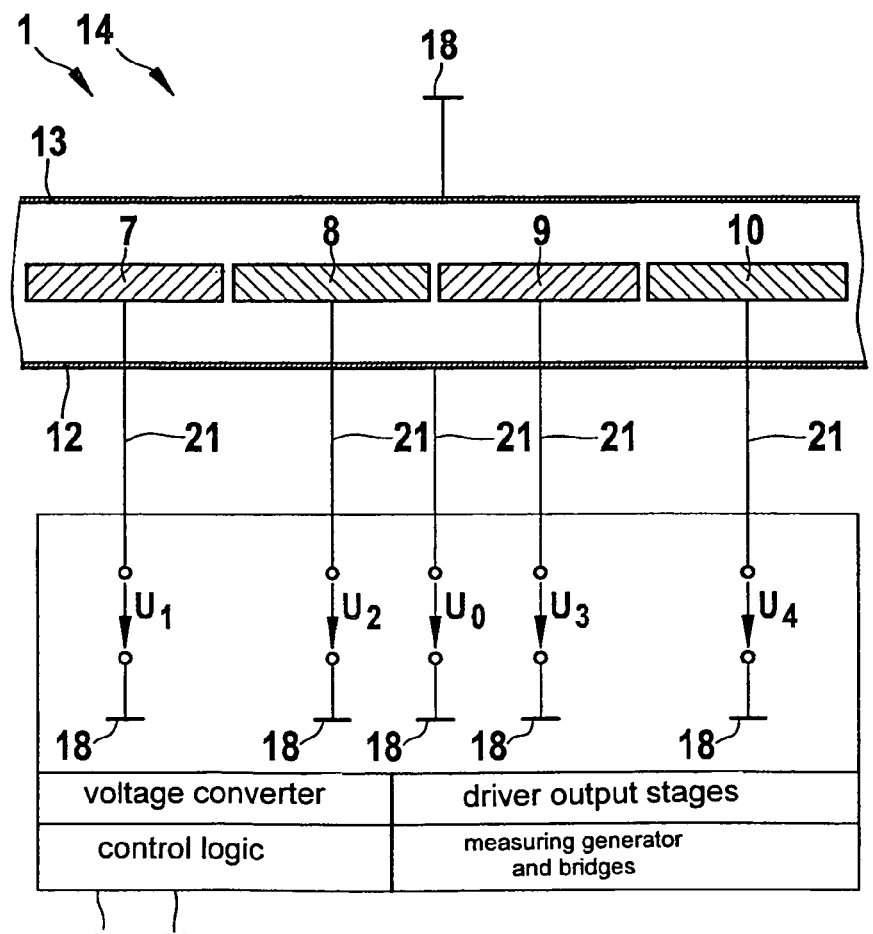
FIG. 2 shows the first example embodiment, to which an electric voltage-control device or charge-control device is assigned.

FIG. 2 shows first example embodiment 1, to which an electronic voltage-control device 17 has been assigned, which has independently controlled electric voltage sources $U_0$, $U_1$, $U_2$, $U_3$, and $U_4$. Each of these voltage sources $U_0$, $U_1$, $U_2$, $U_3$, and $U_4$ is electrically connected to precisely one of inner electrodes 7, 8, 9, 10 via an individual line 21. Electrodes 7, 8, 9, 10 are able to be charged and discharged independently of each other. Outer electrodes 12, 13 are electrically connected to a ground potential 18.

According to one further development of first example embodiment 1, each inner electrode 7, 8, 9, 10 is connected to precisely one of the charge sources of an electronic charge-control device 20 via separate individual lines 21.

Electrode system 14 is able to be interconnected by voltage-control device 17 or charge-control device 20 so as to form a capacitive network having variable capacitance (capacitance matrix).

FIGS. 3 through 8 show consecutive displacement steps 24, 25, 26 of a first example implementation type of the method according to the present invention in the first example embodiment 1 of the device, which features a progressive local excitation of an electric displacement field 19 with the aid of voltage- or charge-controlled charging and discharging of field-exciting electrode system 14. In each displacement step 24, 25 and 26, local electric field excitation 19" is maintained at constant electrode voltages or electrode charges, until a displacement force 27' on boundary surface 16 has subsided. In the region of dielectric boundary surface 16 between fluid 4 having permittivity $\in_2$ and fluid 3 having permittivity $\in_1$, a local electric field 19', which runs ahead of boundary surface 16 in displacement direction 27 and is the cause of displacement force 27' acting on boundary surface 16, is excited by electrode system 14. Fluid section 4' having higher permittivity strives to reach field-filled interspace of electrode system 14 and displaces fluid 3 having lower permittivity $\in_1$, which causes heat exchange medium 2 overall to continue flowing through flow channel 6 in the direction of displacement force 27' due to the cohesion forces in fluids 3, 4. As soon as displacement force 27' ceases, displacement step 24, 25, 26 has been concluded; the next step is initiated in that the field excitation by voltage-control device 17 and charge-control device 20 transitions to electrodes of system 14 that are adjacent in displacement direction 27.

Figure 3:
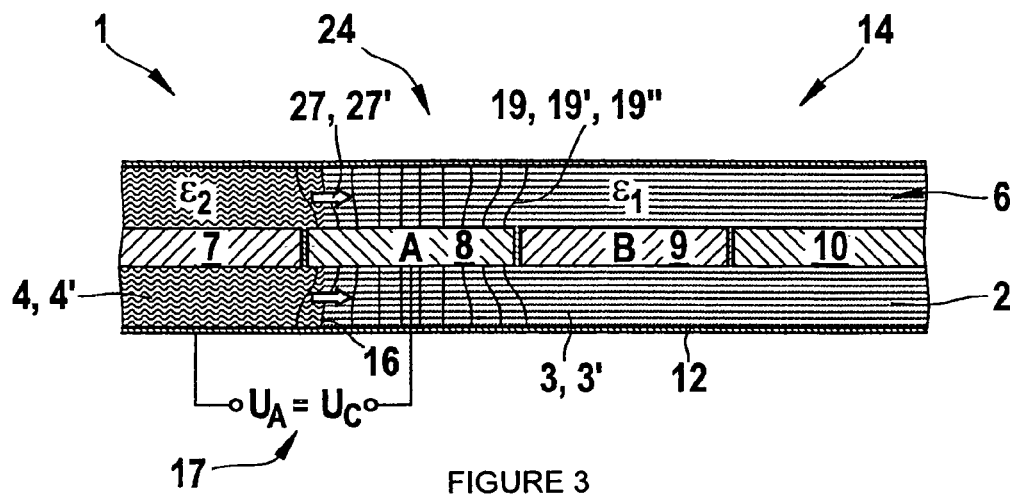
FIG. 3 shows the first example embodiment in a first displacement step of a first implementation type of the method at a constant electrode voltage.
Figure 4:
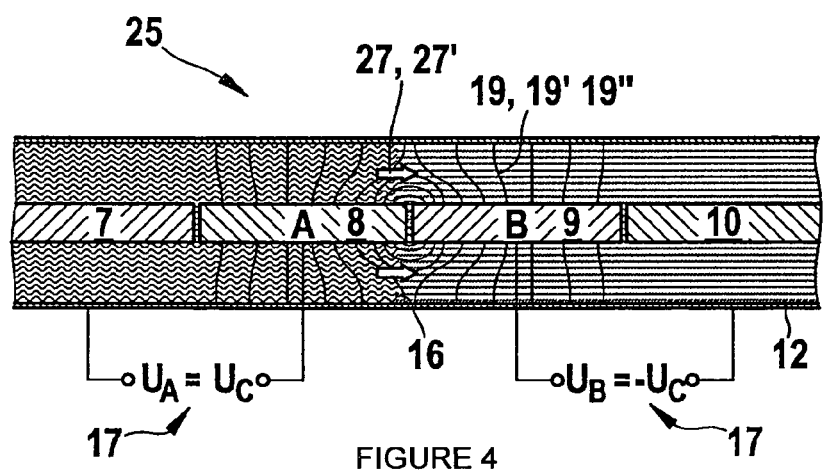
FIG. 4 shows the first example embodiment in a second displacement step of a first implementation type of the method at a constant electrode voltage.
Figure 5:
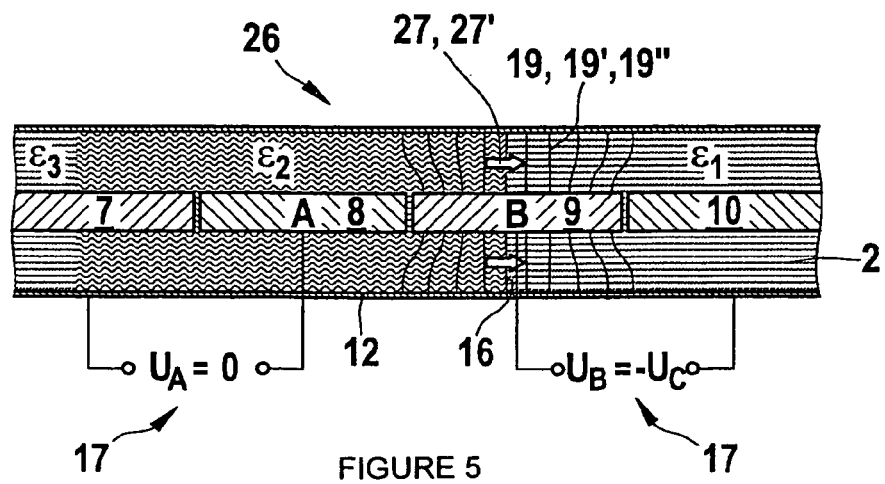
FIG. 5 shows the first example embodiment in a third displacement step of a first implementation type of the method at a constant electrode voltage.

FIGS. 3 through 5 show the displacement of heat exchange medium 2 in first example embodiment 1 when the electrode voltages are held constant intermittently and switched by voltage-control device 17.

In supply step 24 according to FIG. 3, inner electrode 8 and outer electrode 12 excite a local electric field 19' in their interspace in that voltage-control device 17 applies a voltage $U_C$ between inner electrode 8 and outer electrode 12. Displacement field 19 pulls dielectric boundary surface 16 into the interspace of inner electrode 8 and outer electrode 12.

As soon as fluid section 4' having higher permittivity $\in_2$ fills up the interspace of inner electrode 8 and outer electrode 12 and the electrode capacitance determined according to the present invention no longer increases, in supply step 25 according to FIG. 4, voltage-control device 17 applies a voltage $U_B=U_C$ between inner electrode 9 and outer electrode 12, in addition to voltage $U_A=U_C$ a between electrodes 8 and 12. This produces potential difference $2 \cdot U_C$ between inner electrodes 8 and 9, and electric field 19' pulls dielectric boundary surface 16 into the interspace of inner electrodes 8 and 9.

As soon as displacement force 27' on the region of dielectric boundary surface 16 abates and the capacitance of electrode pair 8 and 9 as determined by the method according to the present invention no longer increases, voltage-control device 17 lowers the voltage applied between electrodes 8 and 12 to zero in supply step 26 according to FIG. 5, and electric displacement field 19' is restricted to the interspace of inner electrode 9 and outer electrode 12, where it is exerting a displacement force 27' on heat exchange medium 2 in the environment of advanced dielectric boundary surface 16.

As a function of applied voltage U and capacitance C, the electrostatic energy in field-exciting electrode system 14 amounts to $$W_e = \tfrac{1}{2} C U^2.$$

If a fluid section having higher permittivity $\in_2 > \in_1$ path s penetrates the interspace of the field-exciting electrodes, then capacitance $C(s)$ increases, the capacitance per unit length $$k(s) := dC/ds$$

is greater than zero. Given capacitance variation $\delta C = k \, \delta s$ along infinitesimal path $\delta s$, there is a change in $W_e$ according to $$\delta W_e = \tfrac{1}{2} U^2 \delta C = \tfrac{1}{2} U^2 k \delta S.$$

With a constant voltage U, charge quantity $\delta Q = U \delta C$ or $-\delta Q$ flows to the electrodes, and energy $$\delta W_q = U \delta Q = U^2 \delta C = 2 \delta W_e$$

is removed from the voltage source. If $F_D$ is force 27 acting on dielectric boundary surface 16, and $\delta W_m = F_D \, \delta s$ is the mechanical work performed, then the energy balance is $W_q = W_e + W_m$, so that:

$$\delta W_q = \delta W_e + \delta W_m$$

$$\delta W_m = \delta W_e = \tfrac{1}{2} U^2 k \delta s =>$$

$$F_D = \tfrac{1}{2} U^2 k$$

If sections of the electrode system have a cylindrical shape, that is to say, the cross-section and the capacitance per unit length in this section is constant along the flow direction, then capacitance k per unit length, and thus force $F_D$, are independent of the position of dielectric boundary surface 16.

Figure 6:
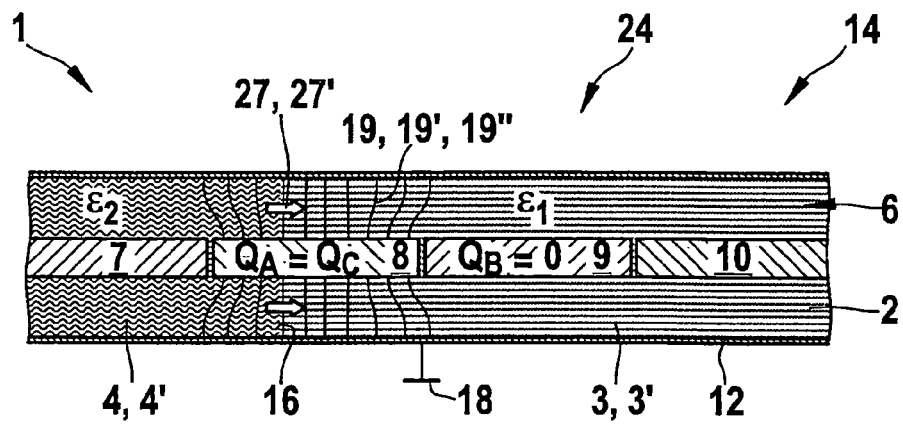
FIG. 6 shows the first example embodiment in a first displacement step of a first implementation type of the method at a constant electrode charge.
Figure 7:
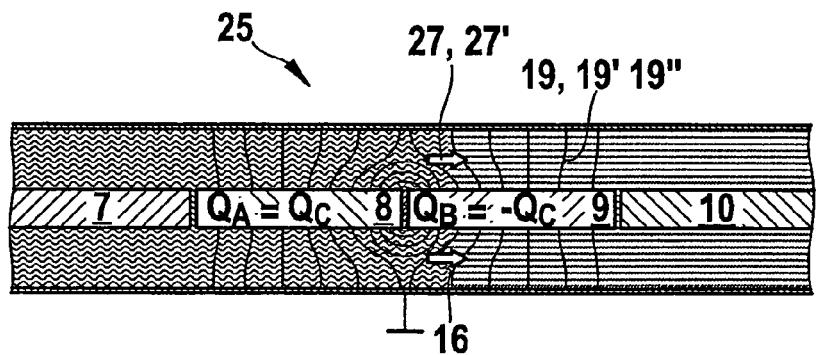
FIG. 7 shows the first example embodiment in a second displacement step of a first implementation type of the method at a constant electrode charge.
Figure 8:
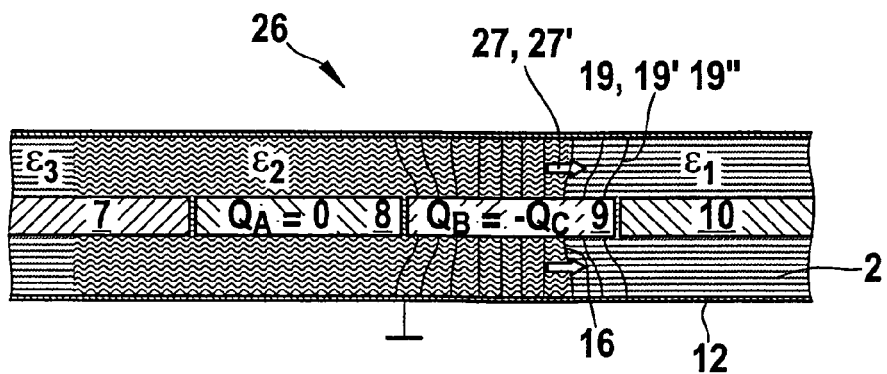
FIG. 8 shows the first example embodiment in a third displacement step of a first implementation type of the method at a constant electrode charge.

FIGS. 6 through 8 show displacement steps of heat exchange medium 2 during progressive electric field excitation 19" in first implementation 1 when the electrode charges, which are applied and removed with the aid of charge-control device 20, are held constant intermittently.

In supply step 24 according to FIG. 6, charge-control device 20 applies charge $Q_C$ from a charge source to inner electrode 8, outer electrode 12 being at ground potential 18. Electrodes 8 and 12 excite a local electric field 19' in their interspace, into which boundary surface 16 is surging. As soon as fluid section 4' having higher permittivity $\in_2$ fills up the interspace of inner electrode 8 and outer electrode 12 and the electrode capacitance determined according to the present invention no longer increases, charge-control device 20 applies charge $-Q_C$ to inner electrode 9 in supply step 25 according to FIG. 7. This produces potential difference $2 \cdot Q_C$ on inner electrodes 8 and 9, and electric field 19' pulls dielectric boundary surface 16 into the interspace of electrodes 8 and 9.

As soon as displacement force 27' on the environment of dielectric boundary surface 16 abates and the capacitance of electrode pair 8 and 9 determined according to the present invention no longer increases, charge-control device 20 removes charge $Q_C$ from inner electrode 8 in supply step 26 according to FIG. 8. Electric displacement field 19 thus is restricted to the interspace of inner electrode 9 and outer electrode 12, where it exerts a displacement force 27' on heat exchange medium 2 in the region of advanced dielectric boundary surface 16.

As a function of charge Q, the electrostatic energy of field-exciting electrode system 14 amounts to $$W_e + \tfrac{1}{2} Q^2/C.$$

The capacitance variation $\delta C = k\, \delta s$ at a constant electrode charge Q changes $W_e$ according to $$\delta W_e = -\tfrac{1}{2}(Q^2/C^2) k \delta s.$$

When the electrode clamps are open, no energy is removed from the voltage source:

$$\delta W_q = U \delta Q = 0.$$

Thus, energy $W_e + W_m$ of electrode system 14 together with the dielectric is maintained:

$$\delta W_e + \delta W_m = 0 \Leftrightarrow \delta W_m = -\delta W_e = \tfrac{1}{2}(Q^2/C^2) k \delta s.$$

Acting on dielectric boundary surface 16 is force $$F_D = \tfrac{1}{2}(Q^2/C^2) k.$$

If electrode system 14 is cylindrical along a section of length H, and if h<H is the penetration depth of dielectric boundary surface 16, then a cylindrical capacitor is obtained, which has a dielectric layered in the longitudinal direction and has the capacitance $$C(h) = k_0 [\in_2 h + (H-h)\in_1] = k_0 [(\in_2 - \in_1) h + H \in_1],$$

where $k_0$ is the capacitor's constant capacitance per unit length without dielectric. Disregarding edge and stray fields, the capacitance per unit length of the axially layered cylinder capacitor thus is $$k = dC/dh = k_0 (\in_2 - \in_1).$$

Force $F_D = \tfrac{1}{2} U^2 k_0 (\in_2 - \in_1)$ or $F_D = \tfrac{1}{2}(Q/C)^2 k_0 (\in_2 - \in_1)$ on dielectric boundary surface 16 at a constant voltage in the homogeneous field is independent of penetration depth h<H. At a constant charge Q, force $F_D$ decreases with increasing penetration depth h and capacitance C(h). For plate electrodes having width b at distance d, $$K_0 = \in_0 b/d \text{ (dielectric constant } \in_0 = 8.85 \cdot 10\text{-}12 F/m),$$

and for the circular-cylindrical inner and outer electrode having radii $r_A$ (inner radius of the outer electrode) and $r_B$ (outer radius of inner electrode)

$$k_0 = 2\pi \in_0 / \ln(r_A/r_B).$$

Figure 9:
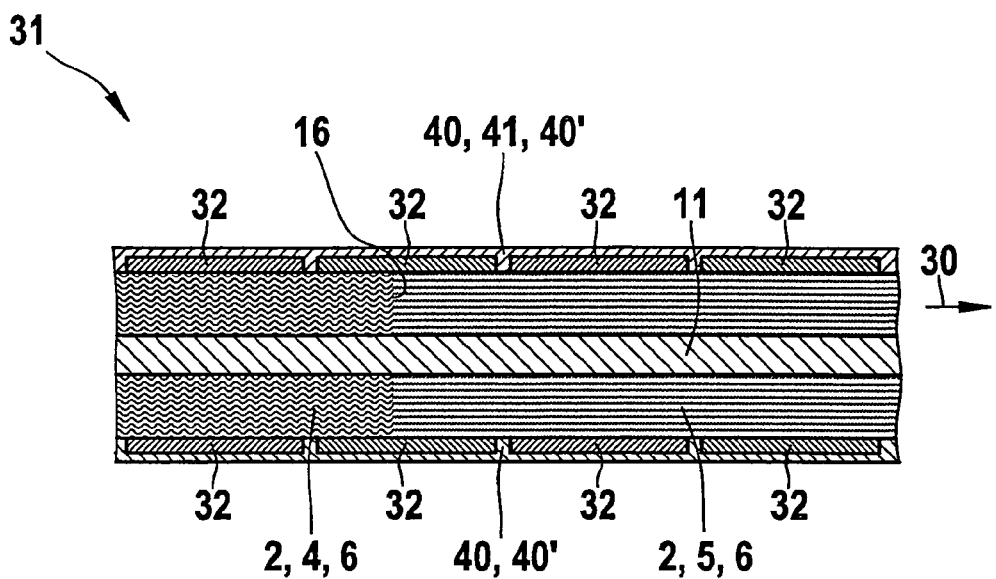
FIG. 9 shows a second example embodiment of the device according to the present invention, the device having an inner electrode.

FIG. 9 shows a second example embodiment 31 of the device according to the present invention, which has a one-piece inner electrode 11, which is continuous in flow direction 30 of heat exchange medium 2, and a one-piece sealed outer wall 40, which is made of an electrically insulating material. Individual outer electrodes 32, which are electrically insulated from each other and embedded in outer wall 40 or affixed on top of it, are disposed along flow direction 30. Outer electrodes 32 and inner electrode 11 are electrically separated from each other. The space between inner electrode 11 and flow wall 40' formed by outer wall 40 and outer electrodes 32 forms flow channel 6 of heat-exchange medium 2.

According to one further development of second example embodiment 31, outer walls 40 and one outer wall 41 are implemented in plate form from electrically insulating material; inner electrode 11 and outer electrodes 32 are likewise implemented in the form of plates. The additional lateral outer walls of flow channel 6 are not shown in FIG. 9. In a technically advantageous manner, outer walls 40 and 41, inner electrode 11 and outer electrodes 32 may have a circular or rectangular cross-section.

Figure 10:
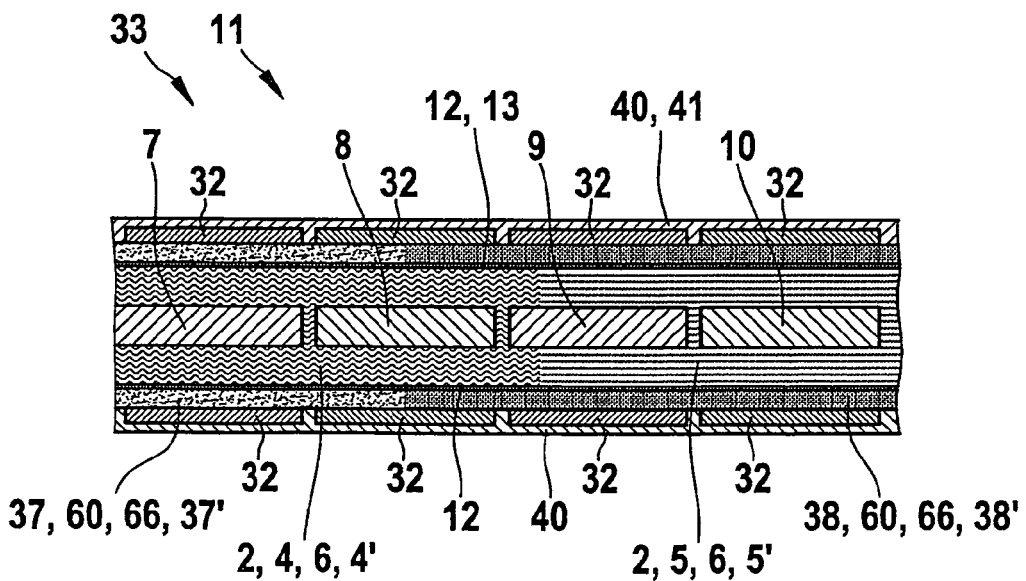
FIG. 10 shows a third example embodiment of an embedded first example embodiment and two separate flow channels.

FIG. 10 shows a third implementation 33 of the device according to the present invention, which results from second implementation 31 in that first implementation 1 replaces inner electrode 11 of second implementation 31. In implementation 33, continuous sealed outer electrodes 12 and 13 of embedded first implementation 1 act as inner electrodes relative to individual, separate outer electrodes 32. In addition to inner flow channel 6 of embedded first implementation 1, in which fluid sections 4' and 5' are flowing, an outer flow channel 60 is produced in the space between sealed outer electrodes 12 and 13 on the one hand, and outer walls 40 and 41 on the other; in this flow channel an additional heat-exchange medium 66, which features fluid sections 27' and 38', is propelled along independently and separately from first heat-exchange medium 2. According to the present invention, a first electrical displacement field 19 is excited in inner flow channel 6, and a second electrical displacement field 19, which is independent of first field 19, is excited in outer flow channel 60.

Figure 11:
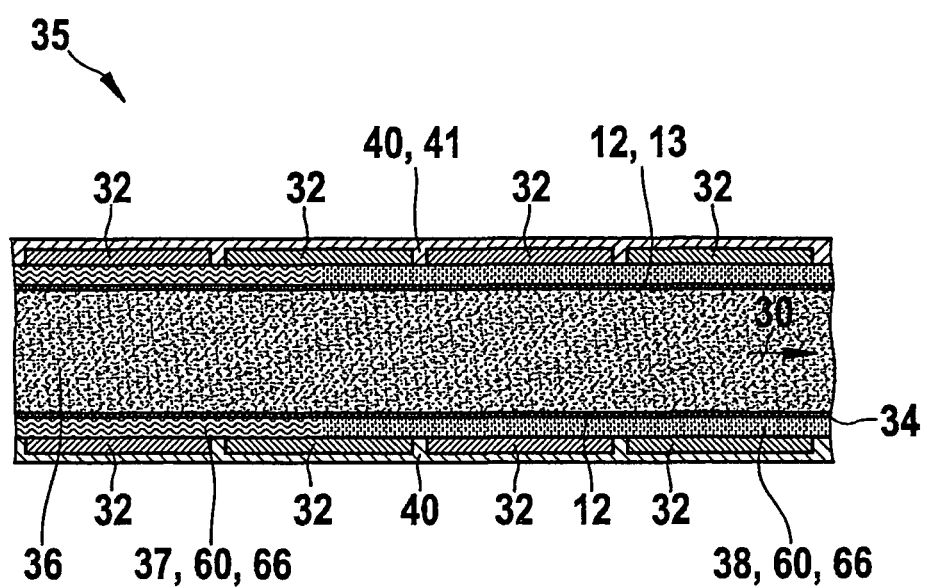
FIG. 11 shows a fourth example embodiment in connection with a heat pipe.

FIG. 11 shows a fourth implementation 35 of the device according to the present invention, which results from third implementation 33 in that inner electrodes 7, 8, 9 and 10 of embedded first implementation 1 are omitted. A gas phase 36 (vapor phase) of heat-exchange medium 66 of a heat pipe 34 is flowing in the interior space of one-piece sealed electrode 12, or in the interspace of separate, plate-shaped electrodes 12 and 13. Similar to third implementation 33, non-mixing liquid phases 37 and 38 of heat-exchange medium 66 are flowing through outer flow channel 60, opposite to flow direction 30 of vapor phase 36.

Figure 12:
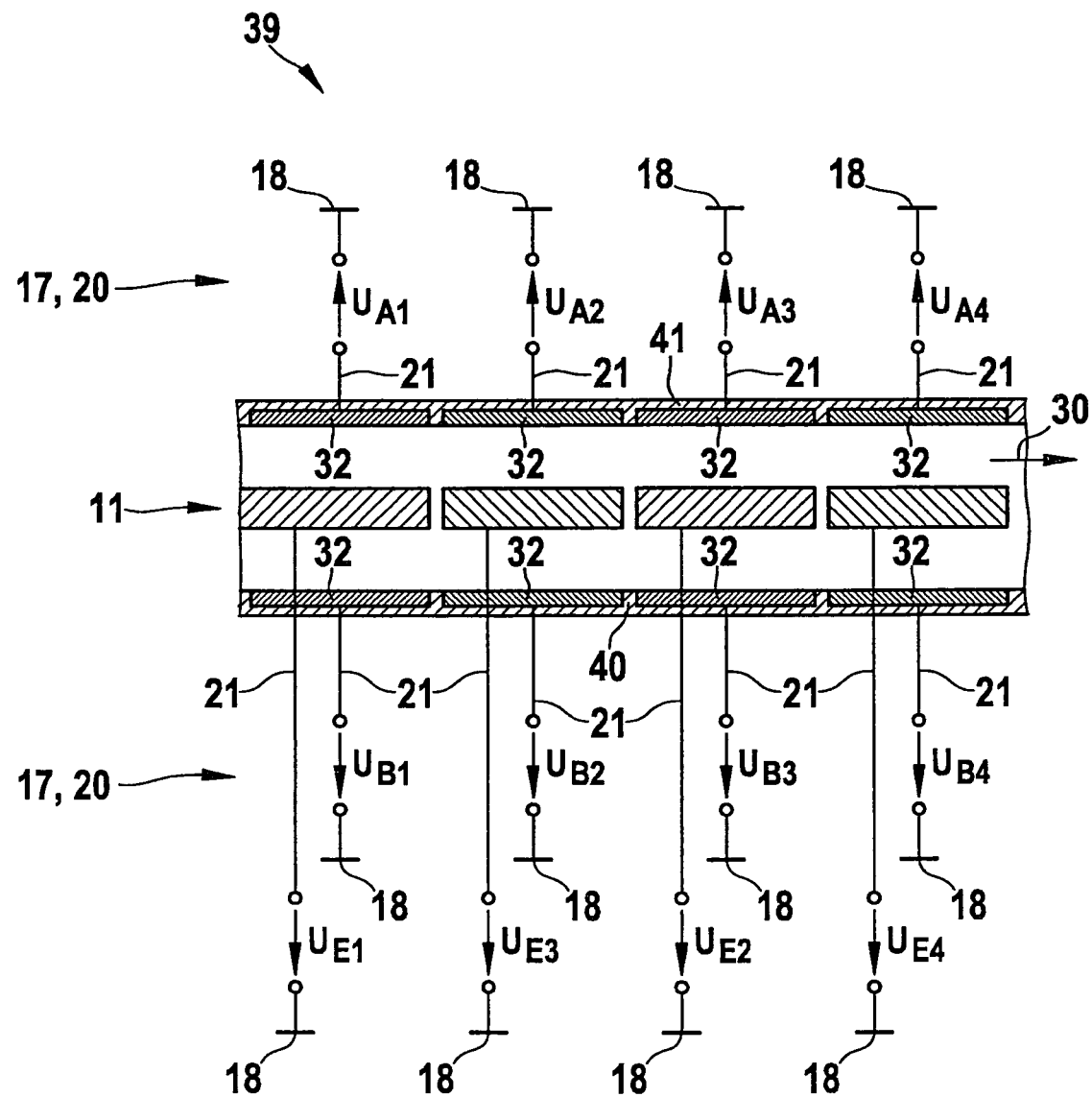
FIG. 12 shows a fifth example embodiment in connection with electric voltage or charge sources.

FIG. 12 shows a fifth implementation 39 of the device according to the present invention; similar to first implementation 1, inner electrode 11 is implemented in multiple parts in this case, and similar to second implementation 31, outer electrodes 32 as well as outer walls 40 and 41 are likewise implemented in several parts which are realized separately from each other. Electrodes 11 and 32 are aligned in flush manner in flow direction 30 at their ends and may sectionally be implemented as sealed pipe or in plate form. In addition, each electrode 11 and 32 is electrically connected to precisely one independently controllable voltage source $U_{A1}$-$U_{A4}$, $U_{B1}$-$U_{B4}$, $U_{E1}$-$U_{E4}$ of voltage-control device 17 or to precisely one independently controllable charge source of charge-control device 20.

Figure 13:
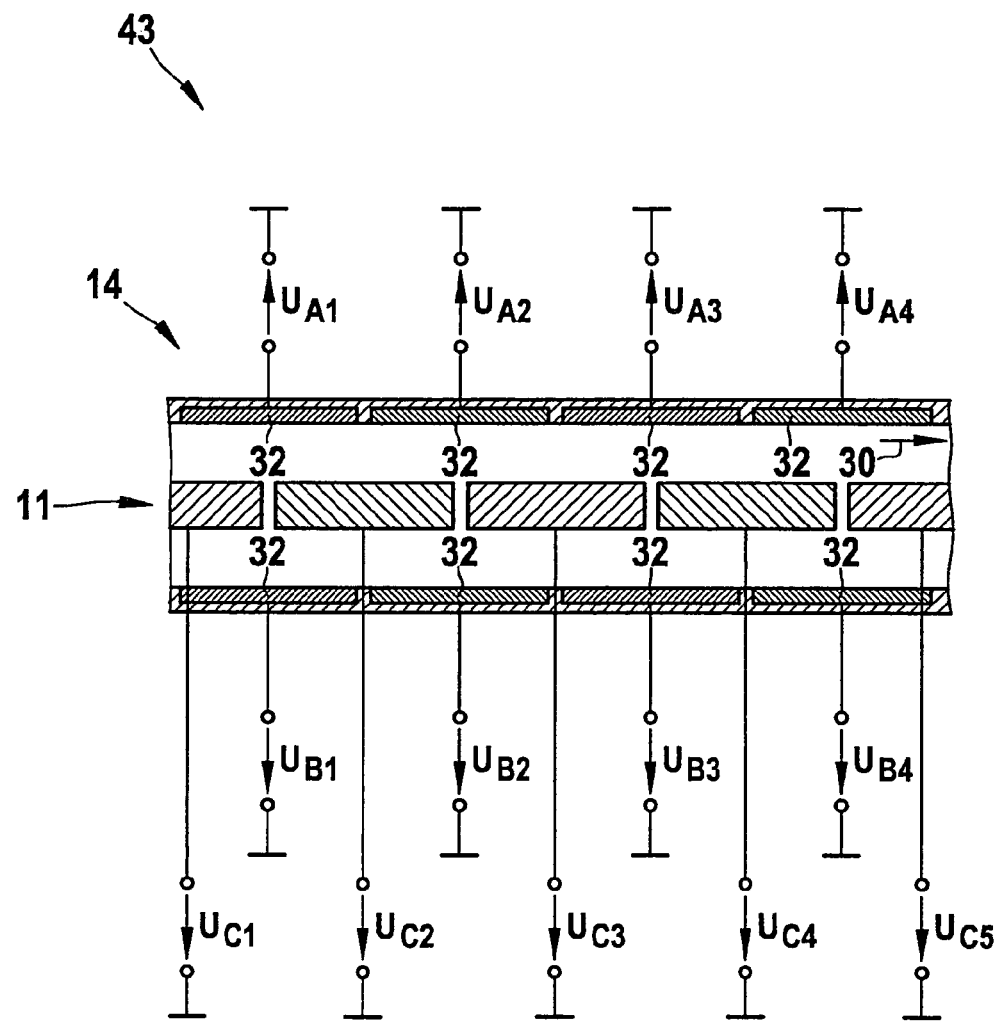
FIG. 13 shows a sixth example embodiment in connection with electric voltage or charge sources.

FIG. 13 shows a sixth implementation 43 of the device according to the present invention, which results from fifth implementation 39 in that the ends of outer electrodes 32 and inner electrodes 11 are disposed at an offset in flow direction 30.

Figure 14:
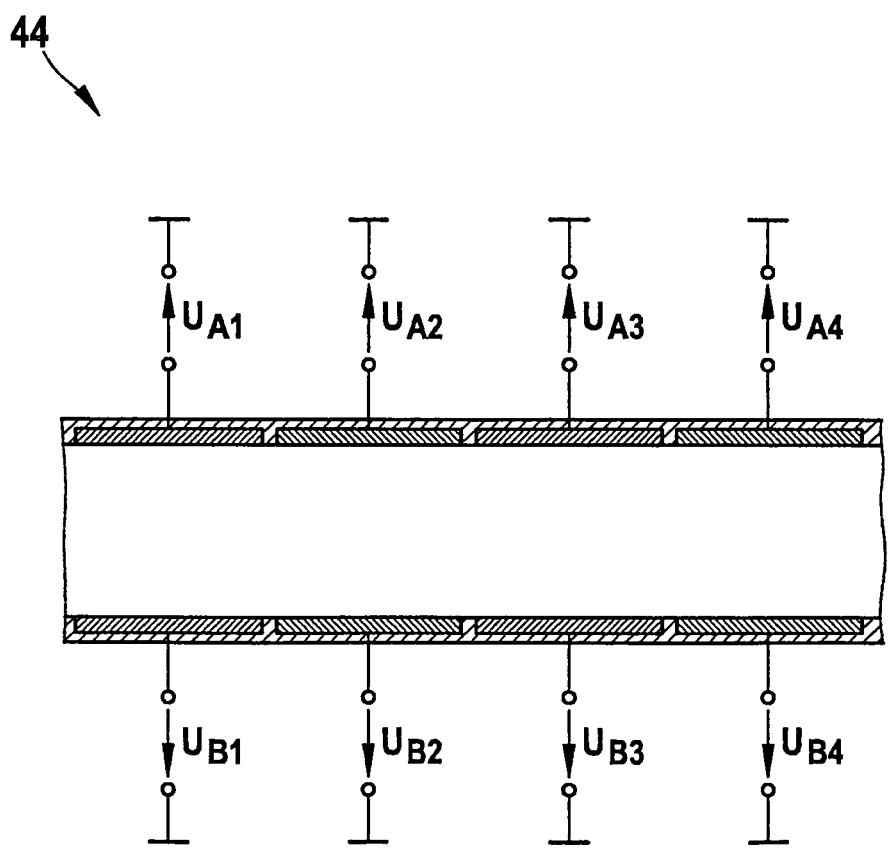
FIG. 14 shows a seventh example embodiment without inner electrodes in connection with electric voltage or charge sources.

FIG. 14 shows a seventh implementation 44 of the device according to the present invention, which results from sixth implementation 43 in that inner electrodes 11 are omitted together with connected voltage-control device 17 or charge-control device 20.

Figure 15:
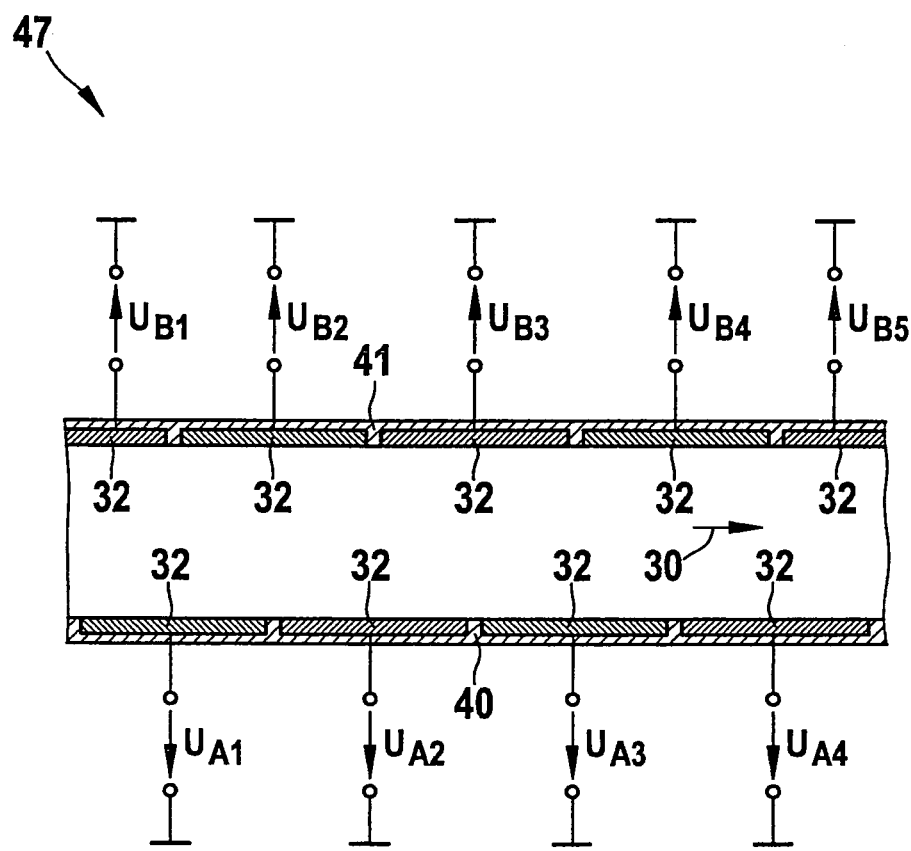
FIG. 15 shows an eighth example embodiment without inner electrodes, having offset outer electrodes in connection with electric voltage or charge sources.
Figure 16:
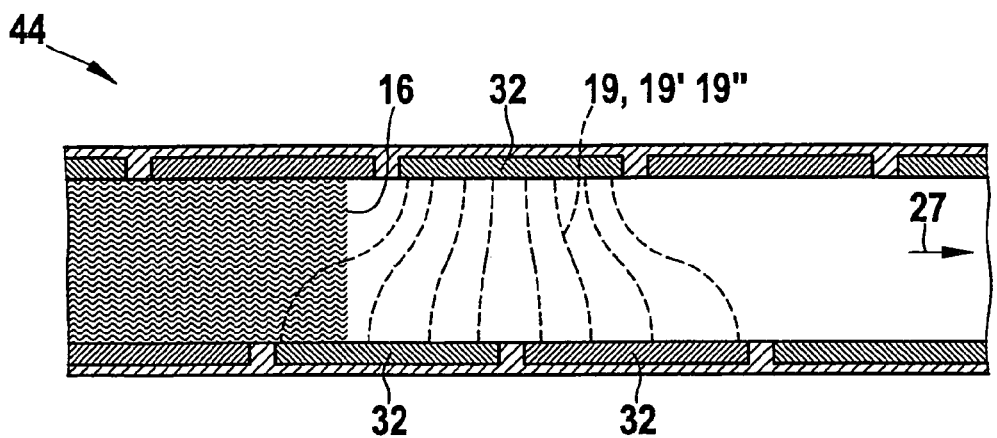
FIG. 16 shows the eighth example embodiment in a first displacement step and state of the electric field excitation of a second implementation type of the method.
Figure 17:
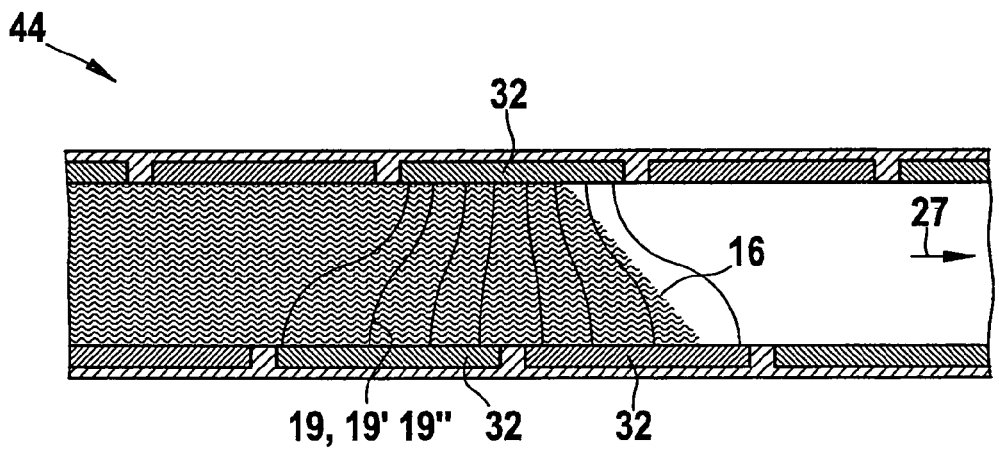
FIG. 17 shows the eighth example embodiment in a second displacement step and state of the electric field excitation of a second implementation type of the method.
Figure 18:
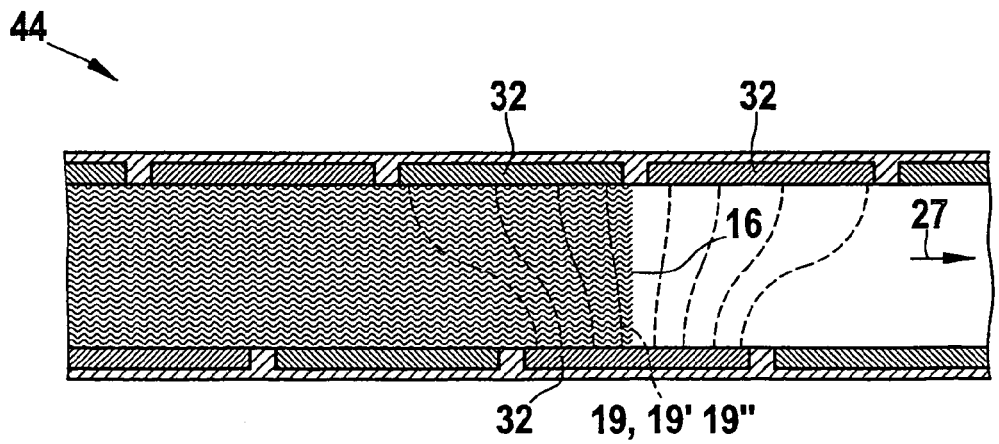
FIG. 18 shows the eighth example embodiment in a third displacement step and state of the electric field excitation of a second implementation type of the method.
Figure 19:
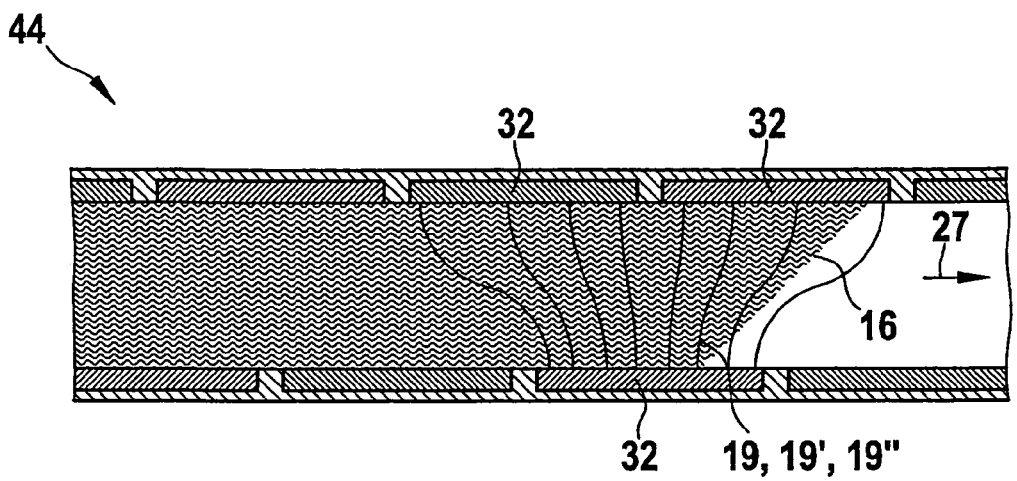
FIG. 19 shows the eighth example embodiment in a fourth displacement step and state of the electric field excitation of a second implementation type of the method.
Figure 20:
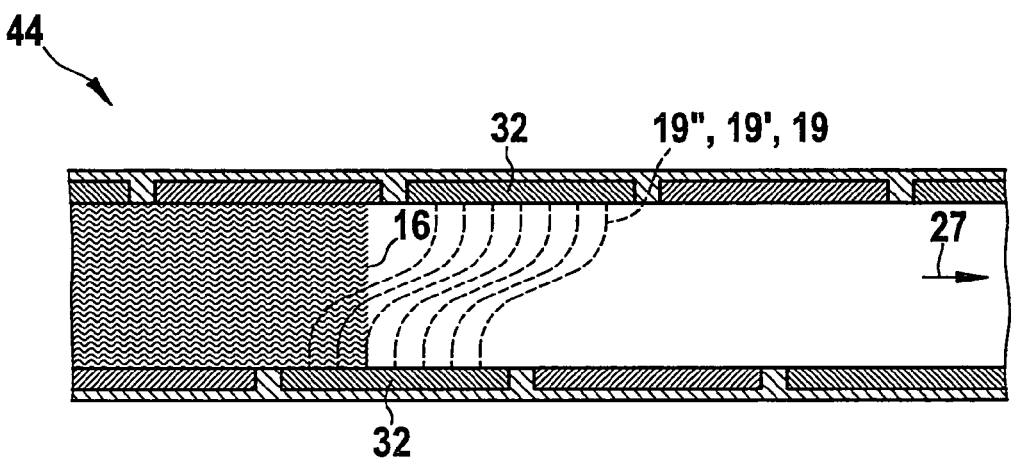
FIG. 20 shows the eighth example embodiment in a first displacement step and state of the electric field excitation of a third implementation type of the method.
Figure 21:
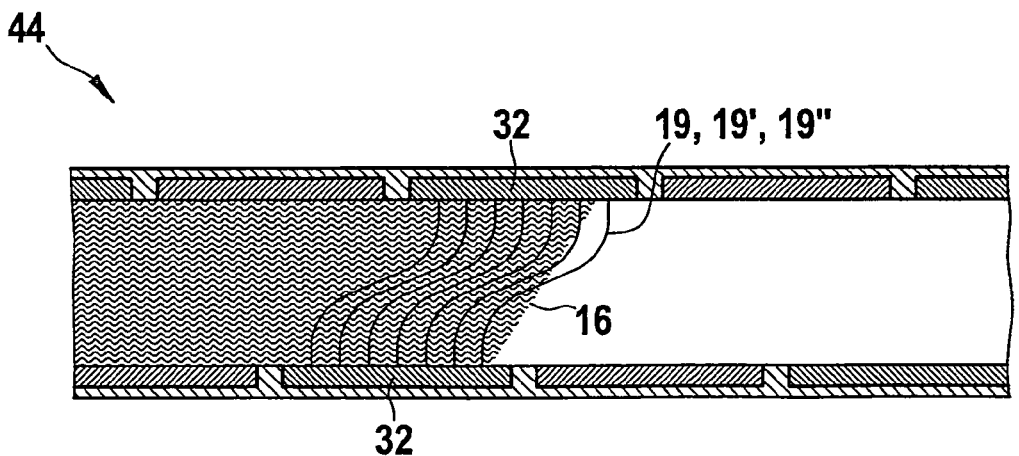
FIG. 21 shows the eighth example embodiment in a second displacement step and state of the electric field excitation of a third implementation type of the method.
Figure 22:
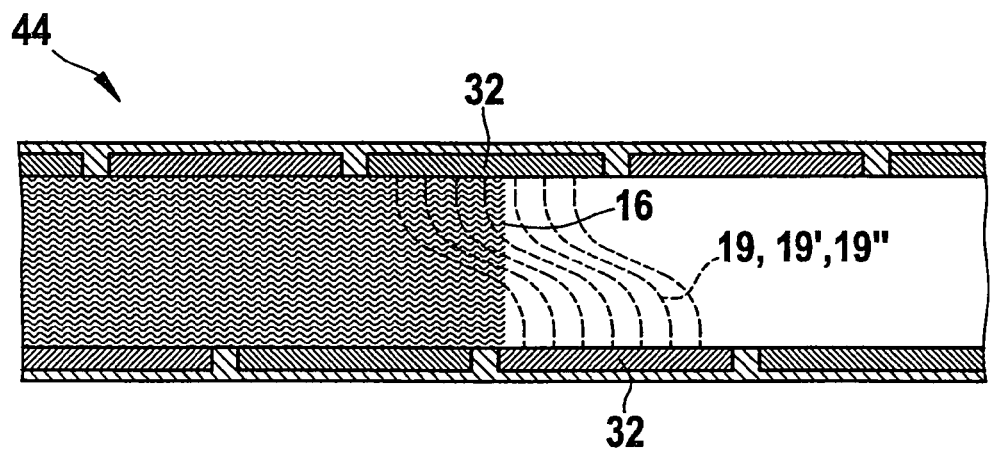
FIG. 22 shows the eighth example embodiment in a third displacement step and state of the electric field excitation of a third implementation type of the method.
Figure 23:
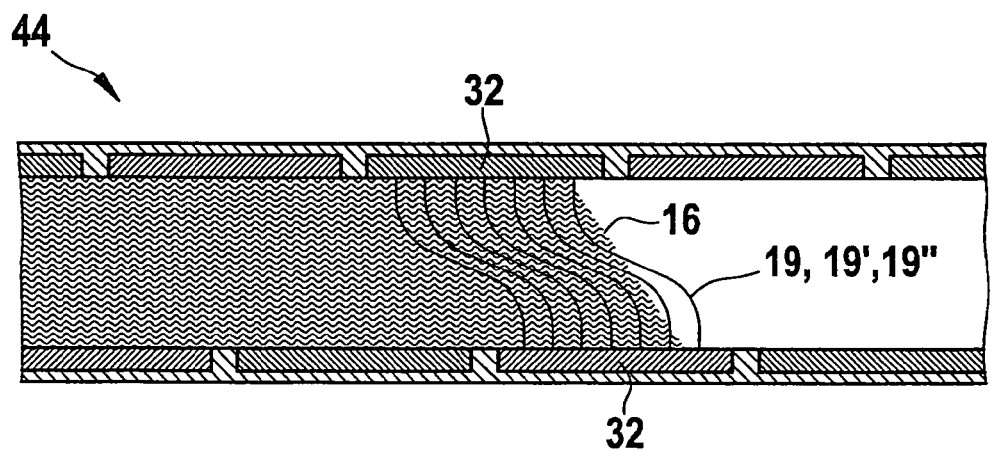
FIG. 23 shows the eighth example embodiment in a fourth displacement step and state of the electric field excitation of a third implementation type of the method.

FIG. 15 shows an eighth implementation 47 of the device according to the present invention, which results from seventh implementation 44 in that the ends of outer electrodes 32, which are embedded in outer wall 40, are disposed at a mutual offset from each other in flow direction 30 relative to the ends of outer electrodes 32, which are embedded in opposite-lying outer wall 41.

FIGS. 16 through 19 show a second implementation type of the method according to the present invention in eighth implementation 44 of the device, featuring a field excitation 19" spanning the electrodes and progressing in displacement direction 27, by three electrodes 32 in each case. The electrical field lines deform dielectric boundary layer 16 obliquely to displacement direction 27. The representation reproduces the field lines correctly only with regard to quality, surface tensions and capillary forces are not taken into account.

FIGS. 20 through 23 show a third implementation type of the method according to the present invention in eighth implementation 44 of the device, at an increasing field excitation 19" by an individual pair of opposite-lying electrodes 32 disposed at an offset, transversely to displacement direction 27. The electrical field lines distort dielectric boundary surface 16 in terms of quality, similar to the way it is shown in FIGS. 16 through 19.

Figure 24:
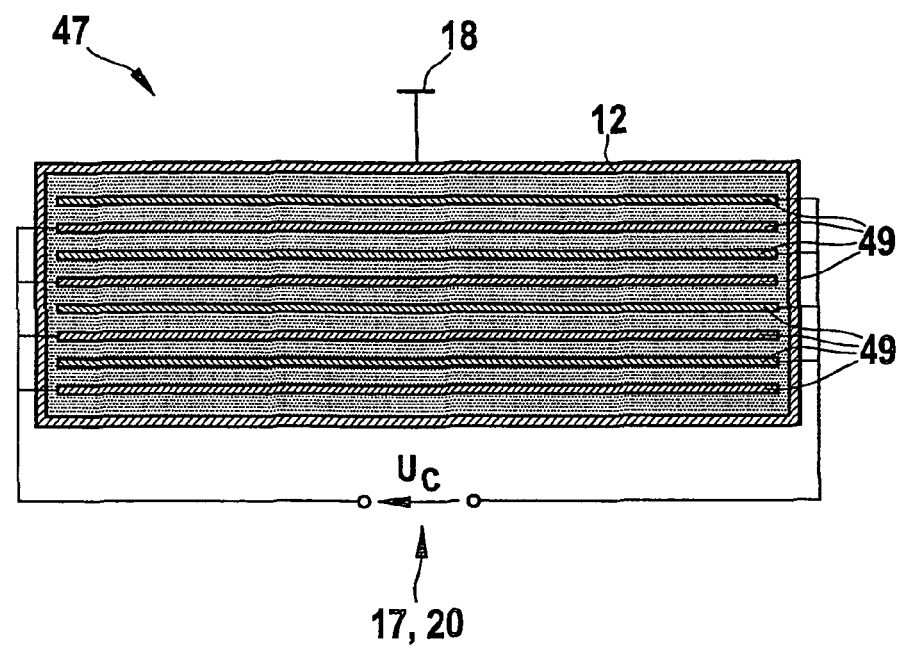
FIG. 24 shows a cross-section of a ninth example embodiment, having meshing, layered plate electrodes and an assigned electric voltage source.
Figure 25:
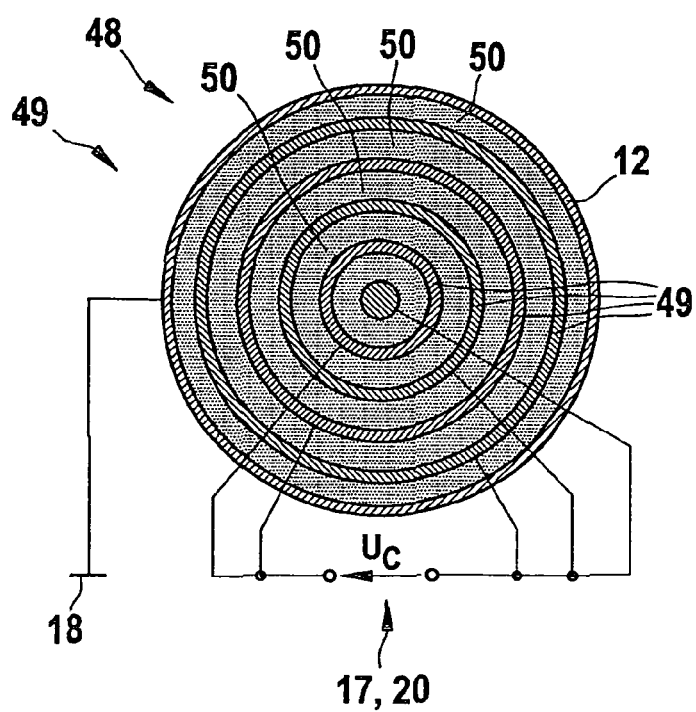
FIG. 25 shows a cross-section of a tenth example embodiment, having radially layered or wound circular-cylindrical electrodes and an assigned electric voltage source.

FIGS. 24 and 25 represent a ninth implementation 47 and tenth implementation 48, respectively, of the device according to the present invention in a cross-section; the paper plane of the representation is situated orthogonally with respect to flow direction 30 or displacement direction 27. As in conventional layer or roll-type capacitors, a high capacitance per unit length and thus a high displacement force 27' is achieved as a result of the fact that thin inner electrodes 49 are disposed in layered or wound fashion. Instead of an electrolytic carrier foil as it is used in electrolyte capacitors, or a plastic dielectric as it is used in foil capacitors, a support foil 50 which is permeable in displacement direction 27 is provided.

FIG. 24 shows a layer system of plate-shaped, separated electrodes 49, which are enclosed by a sealed, electrically conductive flow wall 12 having a rectangular cross-section, which is connected to ground potential 18. Electrodes 49 and flow wall 12 are disposed separately from each other. Furthermore, the electrical connection of inner electrodes 49 to an electric voltage source of voltage-control device 17 or to a charge source of charge-control device 20 is provided.

FIG. 25 shows a radial layer system of annular, separate electrodes 49, which are enclosed by a sealed, electrically conductive flow wall 12 having a rectangular cross-section, which is connected to ground potential 18. Electrodes 49 and flow wall 12 are disposed separately from each other. Furthermore, the electrical connection of inner electrodes 49 to an electric voltage source of voltage-control device 17 or to a charge source of charge-control device 20 is provided.

What is claimed is:

1. A method for conveying at least one heat exchange medium, comprising:
   providing at least one first fluid of the heat exchange medium having a first permittivity;
   providing at least one second fluid of the heat exchange medium, wherein the second fluid does not mix with the first fluid and has a second permittivity less than the first permittivity;
   forming at least one dielectric boundary surface between the first fluid and the second fluid; and
   exposing the at least one dielectric boundary surface to a progressively and locally excited electric displacement field exerting a displacement force on the at least one dielectric boundary surface, wherein:
      the displacement force causes the dielectric boundary surface to move locations, and
      the electric displacement field is generated by one of a constant voltage and a constant charge at a location ahead of the at least one dielectric boundary surface and in a region of the at least one second fluid so that the electric displacement field pulls the at least one dielectric boundary surface in accordance with the displacement force until the at least one first fluid displaces the at least one second fluid from the location and the displacement force abates.

2. The method as recited in claim 1, wherein a fluid is used as the first fluid and a gas is used as the second fluid, wherein the gas is the vapor phase of the first fluid.

3. The method as recited in claim 1, wherein the displacement force is produced by the electric displacement field excited in at least one region of the dielectric boundary surface, using an electrode system.

4. The method as recited in claim 3, wherein the heat exchange medium is compressed with the aid of a static electric field, and wherein the static electric field is superposed to the electric displacement field.

5. The method as recited in claim 3, wherein the electric displacement field is progressively excited in a displacement direction by shifting electrical charges along a series of electrodes of the electrode system.

6. The method as recited in claim 3, further comprising:
   measuring a capacitance of the electrode system;
   determining a position of the at least one dielectric boundary surface in the heat exchange medium based on the measured capacitance of the electrode system; and
   determining a flow rate of at least one fluid section of the heat exchange medium based on temporal change of the position of the at least one dielectric boundary surface.

7. The method as recited in claim 1, further comprising:
   after the displacement force abates at the location, transitioning the one of the constant voltage and the constant charge to a second location ahead of the at least one dielectric boundary and in a region of the displaced second fluid so that the electric displacement field at the second location pulls the at least one dielectric boundary surface in accordance with the displacement force until the at least one first fluid displaces the at least one second fluid from the second location and the displacement force abates at the second location.

8. A method for conveying at least one heat exchange medium, comprising:
   providing at least one first fluid of the heat exchange medium having a first permittivity;
   providing at least one second fluid of the heat exchange medium, wherein the second fluid does not mix with the first fluid and has a second permittivity different from the first permittivity;
   forming at least one dielectric boundary surface between the first fluid and the second fluid;
   exposing the at least one dielectric boundary surface to a progressively excited electric displacement field exerting a displacement force on the at least one dielectric boundary surface, wherein the displacement force is produced by the electric displacement field excited in at least one region of the dielectric boundary surface, using an electrode system;
   measuring a capacitance of the electrode system;
   determining a position of the at least one dielectric boundary surface in the heat exchange medium based on the measured capacitance of the electrode system;
   determining a flow rate of at least one fluid section of the heat exchange medium based on temporal change of the position of the at least one dielectric boundary surface; and determining a temperature of the at least one fluid section of the heat exchange medium on the basis of the measured capacitance and temperature dependence of the permittivity of the at least one fluid section.

9. The method as recited in claim 8, further comprising:
determining a heat flow based on the determined temperature, the determined flow rate, and a thermal capacitance of the at least one fluid section.

10. A device for conveying at least one heat exchange medium, comprising:
a flow channel configured to convey (i) at least one first fluid of the at least one heat exchange medium having a first permittivity and (ii) at least one second fluid of the at least one heat exchange medium not mixing with the first fluid and having a second permittivity different from the first permittivity, wherein at least one dielectric boundary surface is formed between the first fluid and the second fluid; and
an electrode system having at least two electrodes disposed adjacent to each other in a displacement direction, wherein the electrode system progressively excites an electrical displacement field having a displacement force that causes the dielectric boundary surface to move locations, wherein:
the electrode system includes a connection that supplies one of a constant voltage and a constant charge to generate the electrical displacement field, and
the electrode system generates the electrical displacement field at a first location of the flow channel that is ahead of the dielectric boundary surface and in a region of the at least one second fluid so that the electric displacement field pulls the at least one dielectric boundary surface in accordance with the displacement force until the at least one first fluid displaces the at least one second fluid from the location and the displacement force abates.

11. The device as recited in claim 10, wherein the flow channel extends into interspaces of the electrode system.

12. The device as recited in claim 11, wherein an outer electrode is configured as a sealed outer wall of the flow channel.

13. The device as recited in claim 12, wherein another electrode is completely enclosed by the outer electrode, and wherein the outer electrode and the other electrode are separate from each other.

14. The device as recited in claim 11, wherein at least three electrodes are provided in the electrode system, and wherein two electrodes are configured as outer electrodes separate from each other, and wherein the outer electrodes are electrically separated from each other and one of (i) embedded in an electrically insulating outer wall or (ii) fixed in place on the inside of the outer wall.

15. The device as recited in claim 14, wherein the third electrode is an inner electrode disposed in the interior of the flow channel.

16. The device as recited in claim 11, wherein each electrode of the electrode system is assigned one of (i) a voltage-control device having an independently controlled voltage source, or (ii) a charge-control device having an independently controlled charge source.

17. The device as recited in claim 16, wherein the electrode system includes a device for measuring at least one capacitance.

* * * * *